US010668696B2

(12) United States Patent
Kumeta et al.

(10) Patent No.: US 10,668,696 B2
(45) Date of Patent: Jun. 2, 2020

(54) BONDING STRUCTURE ON GOLD THIN FILM

(71) Applicant: FUJIKURA LTD., Tokyo (JP)

(72) Inventors: Shohei Kumeta, Tokyo (JP); Gento Yoshino, Sakura (JP); Yohei Kasai, Sakura (JP); Akira Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 616 days.

(21) Appl. No.: 15/388,070

(22) Filed: Dec. 22, 2016

(65) Prior Publication Data

US 2017/0100917 A1    Apr. 13, 2017

Related U.S. Application Data

(63) Continuation of application No. PCT/JP2015/056140, filed on Mar. 3, 2015.

(30) Foreign Application Priority Data

Jul. 1, 2014    (JP) ................... 2014-136226

(51) Int. Cl.
*B32B 3/00*  (2006.01)
*B32B 15/04*  (2006.01)
*C09J 5/02*  (2006.01)
*C09J 201/00*  (2006.01)
*C03C 27/04*  (2006.01)
*H01L 23/00*  (2006.01)
*B32B 17/00*  (2006.01)
(Continued)

(52) U.S. Cl.
CPC ............... *B32B 15/04* (2013.01); *B32B 7/12* (2013.01); *B32B 15/20* (2013.01); *B32B 17/00* (2013.01);
(Continued)

(58) Field of Classification Search
None
See application file for complete search history.

(56) References Cited

U.S. PATENT DOCUMENTS

| 4,876,588 A | 10/1989 | Miyamoto |
| 6,488,805 B1 | 12/2002 | Sauer |

(Continued)

FOREIGN PATENT DOCUMENTS

| CN | 1230206 A | 9/1999 |
| CN | 103368517 A | 10/2013 |

(Continued)

OTHER PUBLICATIONS

Extended (supplementary) European Search Report dated Jun. 7, 2017, issued in counterpart European Applicaltion No. 15814156.4. (7 pages).

(Continued)

Primary Examiner — Seth Dumbris
(74) Attorney, Agent, or Firm — Westerman, Hattori, Daniels & Adrian, LLP

(57) ABSTRACT

The present invention provides a bonding method (S1) which is capable of achieving a high adhesive force without carrying out any special treatment on the second member (14), even in a case where the first member (11) has a surface on which a gold thin film (12) is formed. The first member (11) is made of a material other than gold and has a surface on which the gold thin film (12) is formed. The bonding method (S1) includes the steps of: (S11) irradiating, with laser light, at least part of a specific region (12a) of the surface of the first member (11), so that a base of the thin film (12) is exposed in the at least part of the specific region (12a); and (S12) bonding the second member (14) to the specific region (12a) by use of an adhesive (13).

5 Claims, 4 Drawing Sheets

(51) Int. Cl.
  *B32B 15/20* (2006.01)
  *B32B 7/12* (2006.01)
  *B32B 37/12* (2006.01)
  *B32B 38/00* (2006.01)

(52) U.S. Cl.
  CPC .......... *B32B 37/12* (2013.01); *B32B 38/0008* (2013.01); *C03C 27/048* (2013.01); *C09J 5/02* (2013.01); *C09J 201/00* (2013.01); *H01L 24/83* (2013.01); *B32B 2250/02* (2013.01); *B32B 2250/44* (2013.01); *B32B 2255/06* (2013.01); *B32B 2255/205* (2013.01); *B32B 2255/28* (2013.01); *B32B 2307/412* (2013.01); *B32B 2307/50* (2013.01); *B32B 2307/538* (2013.01); *B32B 2307/732* (2013.01); *B32B 2457/00* (2013.01); *B32B 2551/00* (2013.01); *C09J 2205/31* (2013.01); *C09J 2400/163* (2013.01); *C09J 2400/166* (2013.01); *H01L 24/29* (2013.01); *H01L 24/32* (2013.01); *H01L 2224/2919* (2013.01); *H01L 2224/32245* (2013.01); *H01L 2224/83014* (2013.01); *H01L 2224/8385* (2013.01); *H01L 2224/83395* (2013.01); *H01L 2224/83444* (2013.01); *H01L 2224/83455* (2013.01); *H01L 2224/83874* (2013.01); *H01L 2924/12042* (2013.01); *H01L 2924/15747* (2013.01); *Y10T 428/24917* (2015.01)

(56) References Cited

U.S. PATENT DOCUMENTS

2012/0139111 A1* 6/2012 Ono .................... B81C 1/00269
                                                                257/741
2013/0264109 A1  10/2013 Kamakura

FOREIGN PATENT DOCUMENTS

| EP | 1 134 605 | A2 |   | 9/2001 | |
|----|-----------|----|---|--------|---|
| JP | 64-73750 | A |   | 3/1989 | |
| JP | 2000-138311 | A |   | 5/2000 | |
| JP | 2000-357936 | A |   | 12/2000 | |
| JP | 2001-284676 | A |   | 10/2001 | |
| JP | 2002-84159 | A |   | 3/2002 | |
| JP | 2004-354642 | A |   | 12/2004 | |
| JP | 2006-316290 | A |   | 11/2006 | |
| JP | 2007-167936 | A |   | 7/2007 | |
| JP | 2008-205265 | A |   | 9/2008 | |
| JP | 2010-57087 | A |   | 3/2010 | |
| JP | 2010057087 |   | * | 3/2010 | ............ H01L 41/09 |
| JP | 2013-199834 | A |   | 10/2013 | |
| JP | 2014-12284 | A |   | 1/2014 | |

OTHER PUBLICATIONS

Office Action dated Feb. 2, 2019, issued in counterpart CN Application No. 201580033301.7. (7 pages).
International Search Report dated May 19, 2015, issued in counterpart International Application No. PCT/JP2015/056140 (2 pages).
Decision to Grant a Patent dated Jan. 17, 2017, issued in counterpart Japanese Patent Application No. 2016-076758, with English translation. (4 pages).
English translation of Notification of Reasons For Refusal dated May 12, 2015, issued in counterpart JP Application No. 2014-136226 (8 pages).
English translation of Notification of Reasons For Refusal dated Aug. 4, 2015, issued in counterpart JP Application No. 2014-136226 (5 pages).
English translation of Decision to Grant a Patent dated Mar. 8, 2016, issued in counterpart JP Application No. 2014-136226 (3 pages).

* cited by examiner

| THE NUMBER OF TIMES OF IRRADIATION STEP | 0 | 1 | 2 | 4 | 8 |
|---|---|---|---|---|---|
| SURFACE | | | | | |
| Au-PLATED REGION | 100% | ~88% | ~64% | ~38% | ~0% |
| SURFACE ROUGHNESS Ra [μm] | 0.82 | 0.95 | 0.99 | 1.06 | 1.29 |
| MAXIMUM LEVEL DIFFERENCE Ry [μm] | 6.5 | 6.7 | 8.6 | 8.5 | 11.2 |

BONDING STRUCTURE ON GOLD THIN FILM

CROSS-REFERENCE TO RELATED APPLICATIONS

This application is a Continuation of PCT International application Ser. No. PCT/JP2015/056140 filed in Japan on Mar. 3, 2015, which claims the benefit of Patent Application No. 2014-136226 filed in Japan on Jul. 1, 2014, the entire contents of which are hereby incorporated by reference.

TECHNICAL FIELD

The present invention relates to a method for bonding two members to each other by use of an adhesive. The present invention also relates to a structure including two members which are bonded to each other and a method for manufacturing the structure.

BACKGROUND ART

As a method for bonding two members to each other, a bonding method using solder and a bonding method using an adhesive have widely been used. For example, solder is used for bonding an electronic component to a submount of a laser module and an adhesive is used for bonding an optical component to the submount of the laser module.

In a case where the electronic component and the optical component are bonded to the submount, the following problem occurs. That is, in a case where the electronic component is bonded to the submount by use of solder, it is necessary to plate a surface of the submount with gold in order to obtain sufficient bonding strength. However, a gold-plated surface of the submount makes it difficult to bond the optical component to the submount by use of an adhesive.

The following describes why it is difficult to bond a member to another member having a surface plated with gold. That is, bonding by an adhesive is typically strengthened by intermolecular force generated between molecules constituting the adhesive and atoms or molecules constituting a surface to be bonded of a member. However, since gold atoms are nonpolar atoms, in a case where the surface to be bonded is made of gold, it is impossible to strengthen the bonding by the adhesive by using the intermolecular force.

Patent Literature 1 discloses a bonding method as a technique usable for avoiding the problem. According to the bonding method disclosed in Patent Literature 1, an FIPG (Formed In Place Gasket) which has high bonding strength with respect to metal is used for bonding a metal member and a synthetic resin member to each other.

CITATION LIST

Patent Literature

[Patent Literature 1]
Japanese Patent Application Publication, Tokukai, No. 2013-199834 (Publication date: Oct. 3, 2013)

SUMMARY OF INVENTION

Technical Problem

However, a technique of bonding a second member (e.g., optical component) to a first member (e.g., submount) having a gold-plated surface requires, in addition to use of the FIPG as an adhesive, a step of providing, on a surface of the second member, a synthetic resin material containing aluminum powder. Further, use of the technique also requires a step of causing a synthetic resin material to contain aluminum powder and a step of appropriately controlling the synthetic resin material.

For this reason, there is a demand for realization of a bonding method which is a method for bonding a gold-plated first member and a second member to each other and is capable of achieving a high adhesive force without carrying out any special treatment on the second member.

The present invention has been accomplished in view of the problem, and an object of the present invention is to provide a bonding method which is a method for bonding a first member and a second member to each other and is capable of achieving a high adhesive force without carrying out any special treatment on the second member, even in a case where the first member has a surface on which a gold thin film is formed. Another object of the present invention is to provide a manufacturing method and a structure each of which brings about an effect similar to that of the bonding method.

Solution to Problem

In order to attain the object, a bonding method in accordance with the present invention is a bonding method for bonding a first member and a second member to each other, the first member being made of a material other than gold and having a surface on which a gold thin film is formed, the second member being made of a material other than gold, the bonding method including the steps of: (1) irradiating, with laser light, at least part of a specific region of the surface of the first member, so that a base of the thin film is exposed in the at least pan of the specific region; and (2) bonding the second member to the specific region by use of an adhesive.

In order to attain the object, a manufacturing method for manufacturing a structure including a first member and a second member, the first member being made of a material other than gold and having a surface on which a gold thin film is formed, the manufacturing method including the steps of: (1) irradiating, with laser light, a specific region of the surface of the first member, so that a base of the thin film is exposed in the specific region; and (2) bonding the second member to the specific region by use of an adhesive.

In order to attain the object, a structure in accordance with the present invention is a structure including: a first member; and a second member, the first member being made of a material other than gold and having a surface on which a gold thin film is formed, the surface of the first member containing a specific region in which a base of the thin film is exposed by irradiation with laser light, the second member being bonded to the specific region by use of an adhesive.

Advantageous Effects of Invention

With the present invention, it is possible to achieve a high adhesive force without carrying out any special treatment on the second member, even in a case where the first member has a surface on which a gold thin film is formed.

BRIEF DESCRIPTION OF DRAWINGS (a) of FIG. 1 is a flow chart showing a flow of a bonding method in accordance with an embodiment of the present invention. (b) of FIG. 1 is a perspective view illustrating a first member before an irradiation step is carried out. (c) of FIG. 1 is a perspective view illustrating the first member after the irradiation step is carried out. (d) of FIG. 1 is a perspective view illustrating the first member and a second member after a bonding step is carried out.

Figure 4:
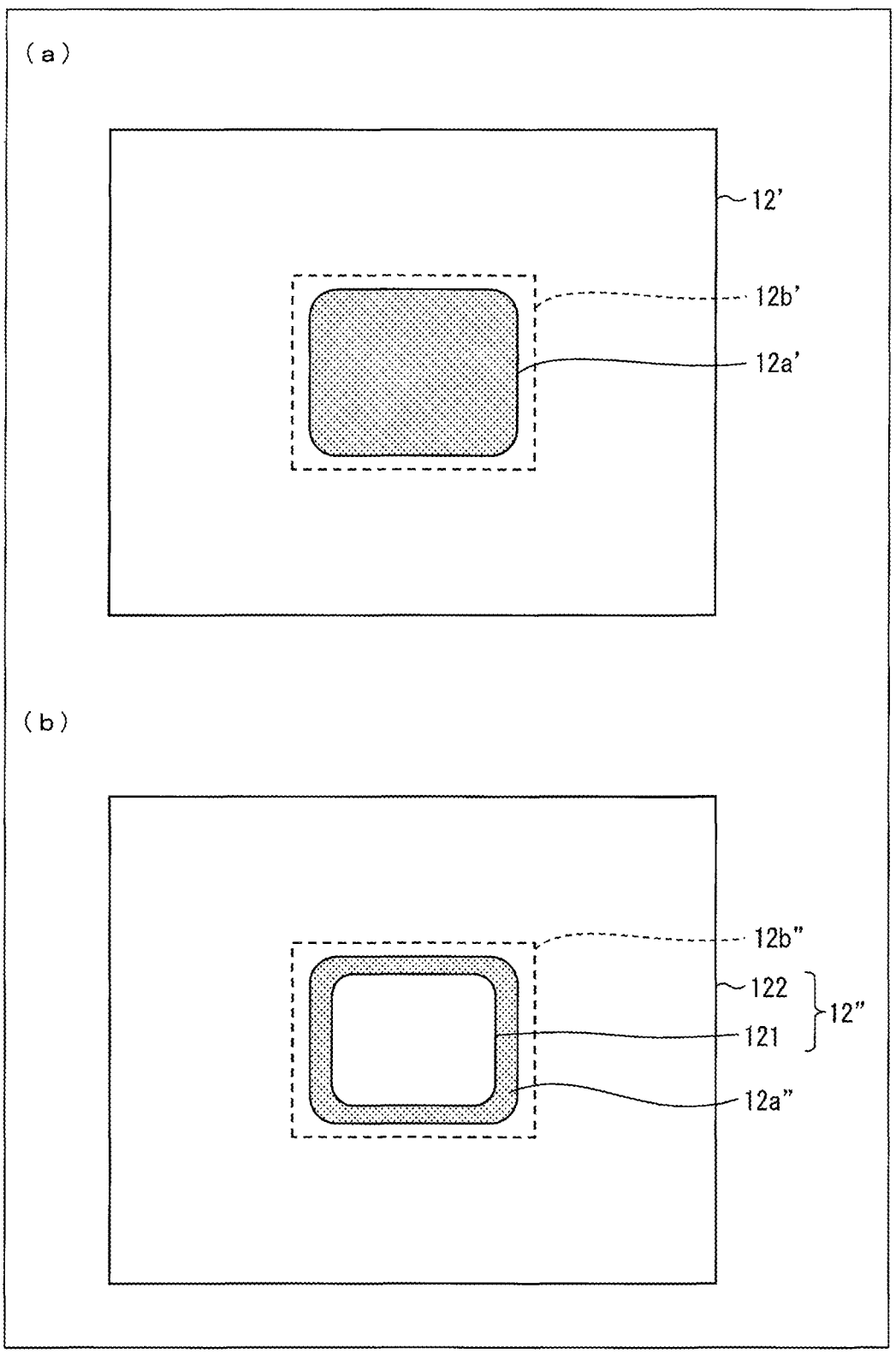

(a) and (b) of FIG. 4 are each a top view illustrating a first member and a thin film after an irradiation step included in a bonding method in accordance with a modified example of the present invention is carried out.

Figure 5:
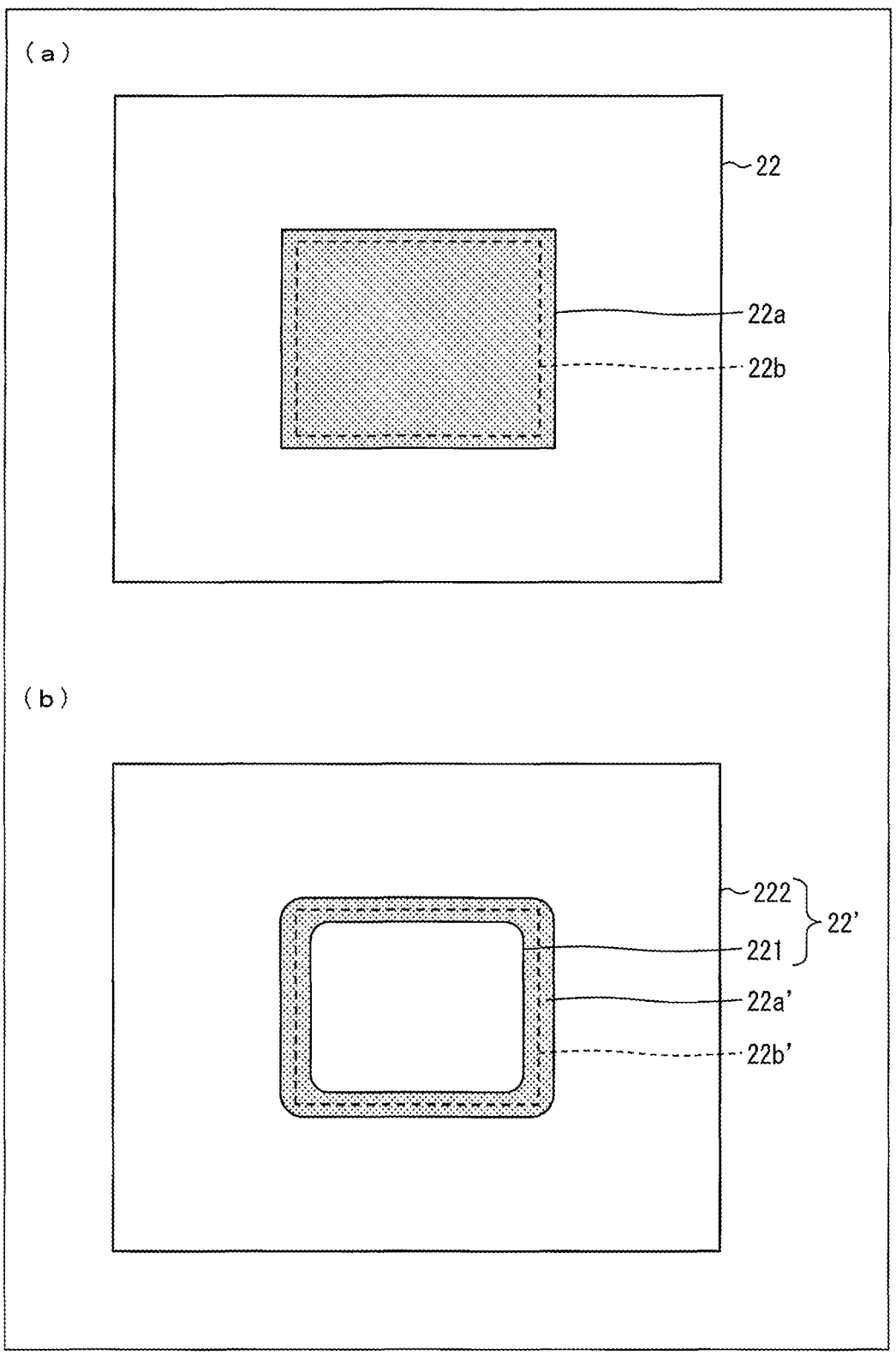

(a) and (b) of FIG. 5 are each a top view illustrating a first member and a thin film after an irradiation step included in a bonding method in accordance with another modified example of the present invention is carried out.

DESCRIPTION OF EMBODIMENTS

Figure 1:
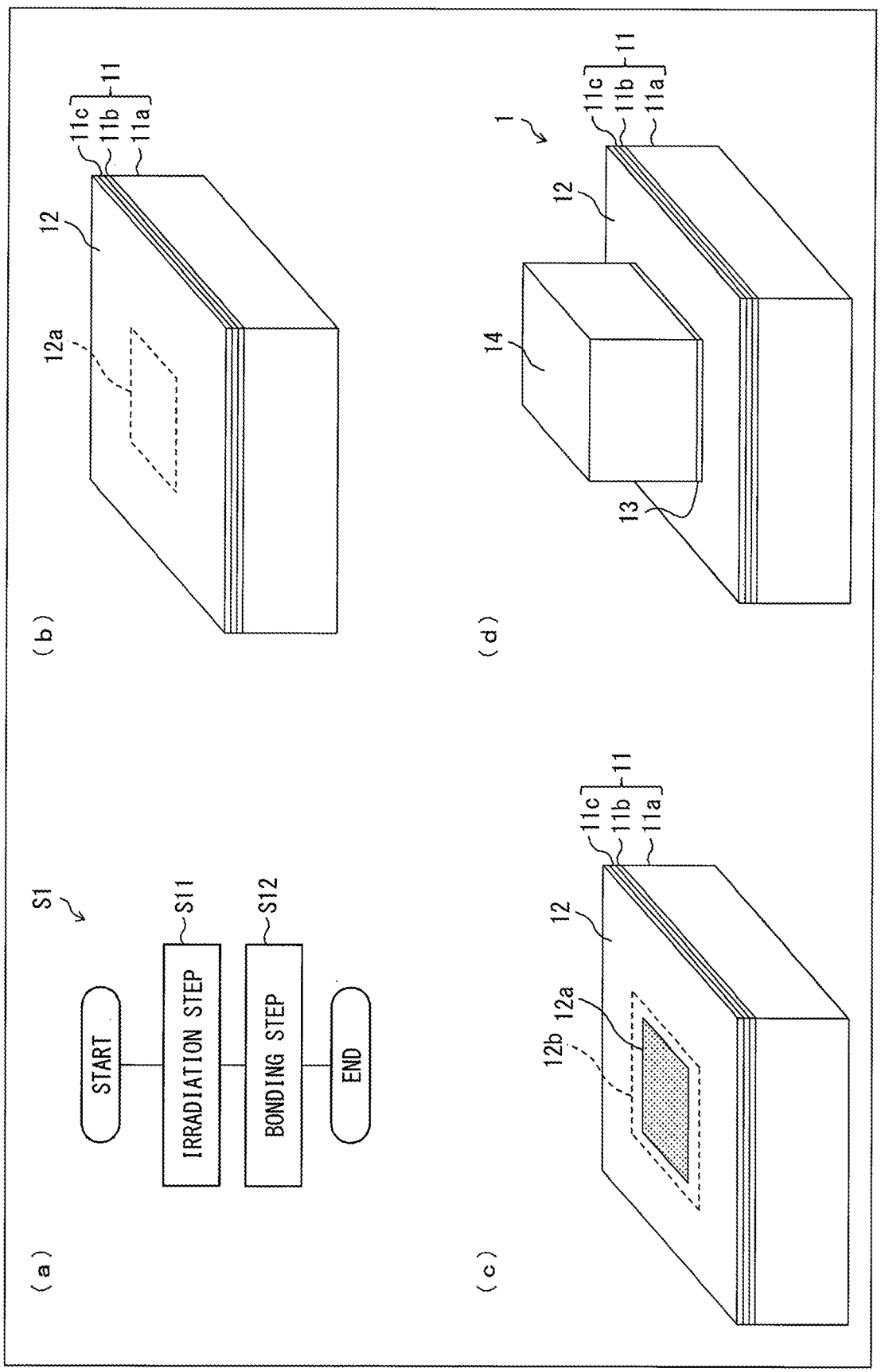

The following description will discuss, with reference to FIG. 1, a bonding method in accordance with an embodiment of the present invention.

(a) of FIG. 1 is a flow chart showing a bonding method S1 in accordance with Embodiment 1.

The bonding method S1 is a method for bonding a first member 11 and a second member 14 to each other and includes an irradiation step S11 and a bonding step S12 as illustrated in (a) of FIG. 1. The following description will discuss, with reference to also (b) through (d) of FIG. 1, the steps included in the bonding method S1.

(b) of FIG. 1 is a perspective view illustrating the first member 11 before the irradiation step S11 is carried out. The first member 11 is made of a material other than gold and has a surface on which a gold thin film 12 is formed (specifically, the first member 11 has a surface which is plated with gold), as illustrated in (b) of FIG. 1.

Embodiment 1 employs, as the first member 11, a member in which, on a surface of a copper base material 11a, a nickel thin film 11b and a palladium thin film 11c are formed in this order (specifically, the surface of the copper base material 11a is plated with nickel and palladium). In this case, the gold thin film 12 is formed on the palladium thin film 11c. Note that materials of the base material 11a and the thin films 11b and 11c can be selected from any materials other than gold. For example, the materials can be aluminum or stainless (SUS). Alternatively, the thin films 11b and 11c can be omitted.

The irradiation step S11 is a step of irradiating, with laser light, at least part of a specific region (hereinafter referred to as "irradiation region") 12a on the thin film 12. In a case where the irradiation step S11 is carried out, gold constituting the thin film 12 is evaporated in the at least part of the irradiation region 12a, so that a base of the thin film 12 is exposed. (c) of FIG. 1 is a perspective view illustrating the first member 11 after the irradiation step S11 is carried out.

In Embodiment 1, each point in the irradiation region 12a is sporadically irradiated with laser light in the irradiation step S11. Specifically, by using a laser marking technique, each irradiation point in the irradiation region 12a is irradiated with pulsed laser light, one pulse at a time. Accordingly, regions in each of which the base is exposed can be densely scattered in the irradiation region 12a. In a case where the irradiation step S11 is repeatedly carried out, it is possible to (i) gradually increase, in the irradiation region 12a, a ratio of the regions in each of which the base is exposed and (ii) gradually reduce, in the irradiation region 12a, a ratio of a region in which the thin film 12 remains.

The bonding step S12 is a step of bonding the second member 14 to a specific region (hereinafter referred to as "bonding region") 12b on the thin film 12 by use of an adhesive 13. By carrying out the bonding step S12, bonding of the first member 11 and the second member 14 to each other is completed. (d) of FIG. 1 is a perspective view illustrating a structure 1 including the first member 11 and the second member 14 which have been bonded to each other by the bonding method S1 in accordance with Embodiment 1.

In Embodiment 1, a photocurable resin such as an ultraviolet curable resin is employed as a material of the adhesive 13 and a transparent material such as glass is employed as a material of the second member 14. This makes it possible to irradiate the adhesive 13 with light (e.g., ultraviolet) through the second member 14, so that the bonding step S12 can be easily carried out. Note, however, that the material of the second member 14 is not limited to the transparent material, but can be selected from any materials other than gold. Further, the adhesive 13 is not limited to the photocurable resin which is cured by light, but can be a resin which is cured by heat or a chemical reaction.

In Embodiment 1, as illustrated in (c) of FIG. 1, the bonding region 12b is set to encompass the irradiation region 12a. In other words, the irradiation region 12a is set to be encompassed in the bonding region 12b. As illustrated in (d) of FIG. 1, this makes it possible to prevent the base (in Embodiment 1, the base material 11a, the thin film 11b, or the thin film 11c) of the thin film 12 from coming into contact with outside air after the bonding step S12 is carried out. Accordingly, it is possible to prevent a deterioration such as corrosion of the base of the thin film 12.

As described above, according to the bonding method S1 in accordance with Embodiment 1, (1) the base of the thin film 12 is exposed in the at least part of the irradiation region 12a by irradiation with laser light, and then (2) the second member 14 is bonded to the irradiation region 12a by use of the adhesive 13. Accordingly, in the at least part of the irradiation region 12a, the second member 14 is bonded to the base (the copper base material 11a, the nickel thin film 11b, or the palladium thin film 11c) made of the material other than gold, instead of being bonded to the gold thin film 12. This can achieve a higher adhesive force as compared with a case where the second member 14 is bonded to the gold thin film 12.

Note that the bonding method S1 in accordance with Embodiment 1 is also applicable to a method for manufacturing the structure 1. An optical module can be an example of the structure 1 which can be manufactured by the bonding method S1 in accordance with Embodiment 1. In the optical module, (1) a laser light source (e.g., a laser diode (LD)) which emits laser light, (2) an electronic component for driving the LD, (3) an optical member (e.g., a mirror or a lens) which directs the laser light to an optical fiber, and the like are provided on a substrate or a submount stacked on the substrate. Note that a surface of the substrate or the submount is often plated with gold. Thus, the bonding method in accordance with the present invention is applied when the substrate or the submount (corresponding to the first member 11) and the optical member (corresponding to the second member 14) are bonded to each other. This makes it possible to favorably bond the optical member to the surface of the substrate or the submount by use of an adhesive, even in a case where the surface of the substrate or the submount is plated with gold. The structure 1 (e.g., the optical module) which is manufactured by the bonding method S1 in accordance with Embodiment 1 is also encompassed in the scope of the present invention.

EXAMPLES

Figures 2, 3:
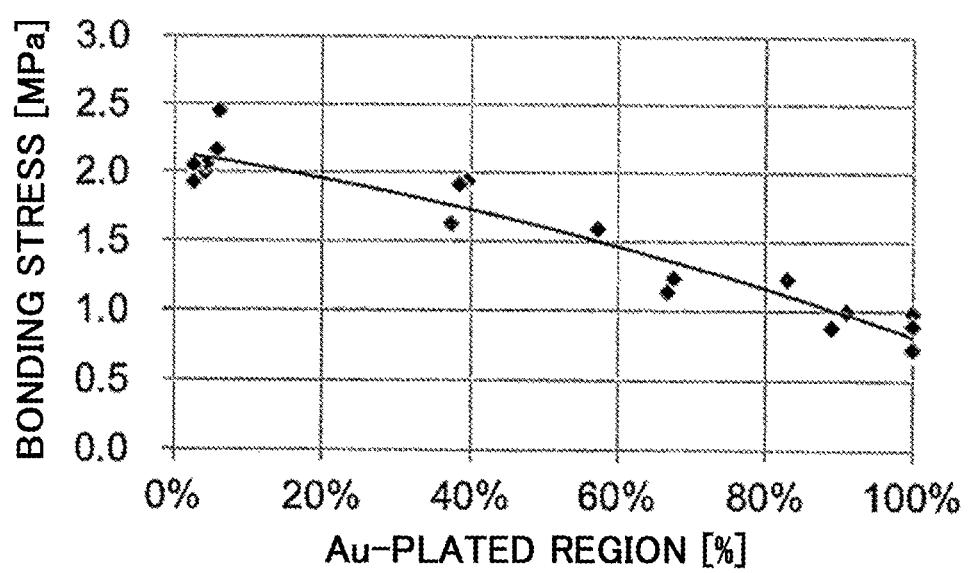
FIG. 2 is a table showing a state of a surface of an irradiation region of a first member, a ratio of an Au-plated region, a surface roughness, and a maximum level difference in each of Comparative Example and Examples 1 through 4.
FIG. 3 is a graph showing a correlation between a bonding stress between the first member and the second member and the ratio of the Au-plated region.

The following description will discuss examples of the bonding method S1 with reference to FIGS. 2 and 3. The following description will discuss (1) Example 1 in which the irradiation step S11 is carried out once, (2) Example 2 in which the irradiation step S11 is carried out twice, (3) Example 3 in which the irradiation step S11 is carried out four times, and (4) Example 4 in which the irradiation step S11 is carried out eight times.

Note that Examples 1 through 4 employed, as the first member 11, a member in which on a surface of a copper base material 11a, a nickel thin film 11b having a thickness of 1 μm and a palladium thin film 11c having a thickness of 0.1 μm had been formed in this order by a plating method. Further, a gold-plated film which had been formed by the plating method so as to have a thickness of 0.1 μm was employed as the thin film 12. A mirror made of glass was employed as the second member 14. The thin film 12 had a bonding region 12b to which the second member 14 was bonded and which had a rectangular shape identical to a shape of a bottom surface of the mirror. In Examples 1 through 4, a mirror having a bottom surface with an area of 27 mm2 was employed as the minor serving as the second member 14.

In the irradiation step S11, each of irradiation points which were distributed at a predetermined density in an irradiation region 12a was irradiated with pulsed laser light having a wavelength of 1064 nm, one pulse at a time. In Examples 1, 2, 3, and 4, the irradiation step S11 was carried out once, twice, four times, and eight times, respectively.

In the bonding step S12, (1) an adhesive 13 (ultraviolet curable resin) was applied to the bonding region 12b, (2) the second member 14 was placed on the bonding region 12b via the adhesive 13, and (3) the adhesive 13 was irradiated with ultraviolet through the second member 14.

FIG. 2 is a table showing a state of a surface of the irradiation region 12a of the first member 11, a ratio of an Au-plated region (a region in which the thin film 12 remained in the irradiation region 12a), a surface roughness Ra, and a maximum level difference Ry in each of Comparative Example (a case where no irradiation step S11 was carried out) and Examples 1 through 4. Note that the maximum level difference Ry is a difference between a highest level and a lowest level in a surface profile of the irradiation region 12a.

As shown in FIG. 2, it was confirmed that as the number of times the irradiation step S11 was carried out increased, the ratio of the Au-plated region gradually decreased, i.e., a ratio of a region in which a base of the thin film 12 was exposed gradually increased. Further, it was confirmed that as the number of times the irradiation step S11 was carried out increased, the surface roughness Ra and the maximum level difference Ry showed a tendency to increase.

Note that the ratio of the Au-plated region was obtained by (i) extracting, by carrying out image processing, a region in which the thin film 12 remained in a photograph obtained by capturing an image of the irradiation region 12a and (ii) calculating a ratio of a sum total of an area of the region thus extracted to an area of the irradiation region 12a.

FIG. 3 is a graph showing a correlation between a bonding stress between the first member 11 and the second member 14 and a ratio of a remaining gold-plated region. Note that the bonding stress is a value obtained by (i) applying a force to the bonding region 12b while gradually increasing the force and (ii) dividing the force by an area of the bonding region 12b at a time point at which the first member 11 and the second member 14 bonded to each other started separating from each other. A higher bonding stress means higher bonding strength.

As shown in FIG. 3, in a case where the ratio of the Au-plated region was 100% (Comparative Example), the bonding stress between the first member 11 and the second member 14 was not less than 0.6 MPa and not more than 1.0 MPa. As the ratio of the Au-plated region decreased from 100%, the bonding stress between the first member 11 and the second member 14 showed a tendency to increase. That is, it was confirmed that as the ratio of the Au-plated region decreased from 100%, the bonding strength increased. Note that in the case where the irradiation step S11 was carried out eight times (Example 4), the bonding stress between the first member 11 and the second member 14 was not less than 1.8 MPa and not more than 2.5 MPa.

In a case where an optical module is manufactured by the bonding method S1, the bonding stress between the first member 11 and the second member 14 is preferably not less than 1.4 MPa. This is based on the finding that, in the optical module, a substrate or a submount which corresponds to the first member 11 may be warped by 10 μm at the maximum. The inventors of the present application found that in a case where the substrate or the submount is warped by 10 μm, a bending stress of approximately 1.4 MPa at the maximum is generated in a bonding region 12b of an optical component corresponding to the second member 14. In a case where the bonding stress between the first member 11 and the second member 14 is not less than 1.4 MPa, it is possible to favorably maintain the bonding between the first member 11 and the second member 14 so that the first member 11 and the second member 14 do not separate from each other even in a case where the first member 11 is warped by 10 μm.

According to the results of measurement of bonding stress shown in FIG. 3, in a case where the ratio of the Au-plated region is not more than 60% (Examples 2 through 4), the bonding stress between the first member 11 and the second member 14 exceeds 1.4 MPa. Accordingly, in the bonding method S1, it is preferable to repeat the irradiation step S11 until the ratio of the Au-plated region becomes not more than 60%.

As described above, in the bonding method S1, the bonding stress between the first member 11 and the second member 14 increases as the number of times the irradiation step S11 is carried out increases. This is primarily because as the number of times at which the irradiation step S11 is carried out increases, the ratio of the Au-plated region in the irradiation region 12a decreases. Further, increasing the number of times the irradiation step S11 is carried out generates secondary effects such as an increase in surface roughness Ra in the irradiation region 12a. The increase in surface roughness Ra results in an increase in area of a region in which the adhesive 13 is bonded to the base of the thin film 12. This consequently improves the bonding stress.

Modified Example 1

The following description will discuss, with reference to (a) and (b) of FIG. 4, two modified examples of the bonding method S1 in accordance with Embodiment 1. (a) and (b) of FIG. 4 are each a top view illustrating the first member 11 after an irradiation step S11 included in a bonding method S1 in accordance with Modified Example 1 is carried out. Note that the first member 11 is completely covered with thin films 12' and 12" in (a) and (b) of FIG. 4, respectively. The thin films 12' and 12" illustrated in respective (a) and (b) of FIG. 4 correspond to the thin film 12 illustrated in (c) of FIG. 1.

The modified example illustrated in (a) of FIG. 4 employs a configuration in which an outer circumference of an irradiation region 12a' which is irradiated with laser light in the irradiation step S11 is constituted by a smooth curved line. With the configuration, the outer circumference of the irradiation region 12a' has no angular corner (vertex) on which a bending stress is likely to concentrate. Accordingly, a bending stress which is generated when the first member 11 is warped is dispersed on the outer circumference of the irradiation region 12a'. This allows a structure bonded by the bonding method in accordance with Modified Example 1 to exhibit a higher bonding stress, as compared with a case where the irradiation region 12a has a rectangular shape (see FIG. 1).

The modified example illustrated in (b) of FIG. 4 employs a configuration in which an irradiation region 12a" irradiated with laser light in the irradiation step S11 is an annular region which (i) has an outer circumference and an inner circumference each of which is constituted by a smooth curved line and (ii) extends along a bonding region 12b" to which the second member 14 is bonded in the bonding step S12. The irradiation region 12a" partitions the thin film 12" into a thin film 121 which is located inside the irradiation region 12a" and a thin film 122 which is located outside the irradiation region 12a".

With the configuration, since the second member 14 is bonded to the irradiation region 12a" having the outer circumference and the inner circumference each of which is constituted by a smooth curved line, the first member 11 and the second member 14 can be bonded to each other so as to exhibit a bonding stress as high as that in the modified example illustrated in (a) of FIG. 4. Further, the configuration allows an area of the irradiation region 12a" to be smaller as compared with the modified example illustrated in (a) of FIG. 4. This makes it possible to reduce a time required for the irradiation step S1.

Modified Example 2

The following description will discuss, with reference to FIG. 5, another two modified examples of the bonding method S1 in accordance with Embodiment 1. (a) and (b) of FIG. 5 are each a top view illustrating a first member 11 after an irradiation step S11 included in a bonding method S1 in accordance with Modified Example 2 is carried out. Note that the first member 11 is completely covered with thin films 22 and 22' in (a) and (b) of FIG. 5, respectively. The thin films 22 and 22' illustrated in respective (a) and (b) of FIG. 5 correspond to the thin film 12 illustrated in (c) of FIG. 1.

The modified example illustrated in (a) of FIG. 5 employs a configuration in which an irradiation region 22a irradiated with laser light in the irradiation step S11 contains a bonding region 22b to which a second member 14 is bonded in a bonding step S12. With the configuration, the irradiation region 22a contains an outer circumference of the bonding region 22b on which outer circumference a bending stress generated when the first member 11 is warped is likely to concentrate. Accordingly, as compared with a case where the irradiation region 12a does not contain the bonding region 12b (see FIG. 1), a structure bonded by the bonding method in accordance with Modified Example 2 exhibits a higher bonding stress.

Note, however, that in a case where a region of the irradiation region 22a in which region a base of the thin film 22 is exposed comes into contact with outside air, a deterioration such as corrosion may occur in the region in which the base of the thin film 22 is exposed. In order to prevent such a deterioration, it is preferable in Modified Example 2 to apply an adhesive 13 to a region containing the irradiation region 22a. That is, it is preferable that the irradiation region 22a be a part of a region to which the adhesive 13 is applied and the bonding region 22b be a part of the irradiation region 22a. This makes it possible to cover, with the adhesive 13, the region in which the base of the thin film 22 is exposed in the irradiation region 22a. Accordingly, it is possible to prevent a deterioration such as corrosion in the region.

The modified example illustrated in (b) of FIG. 5 employs a configuration in which an irradiation region 22a' irradiated with laser light in the irradiation step S11 is an annular region which (i) contains an outer circumference of a bonding region 22b' to which the second member 14 is bonded in the bonding step S12 and (ii) extends along the outer circumference of the bonding region 22b'. The irradiation region 22a' partitions the thin film 22' into a thin film 221 which is located inside the irradiation region 22a' and a thin film 222 which is located outside the irradiation region 22a'.

With the configuration, since the irradiation region 22a' contains the outer circumference of the bonding region 22b', the first member 11 and the second member 14 can be bonded to each other so as to exhibit a bonding stress as high as that in the modified example illustrated in (a) of FIG. 5. Further, the configuration allows an area of the irradiation region 22a' to be smaller as compared with the modified example illustrated in (a) of FIG. 5. This makes it possible to reduce a time required for the irradiation step S11.

In Modified Example 2, (b) of FIG. 5 illustrates the irradiation region 22a' having the outer circumference and the inner circumference each of which is constituted by a smooth curved line. Note, however, that the outer circumference and the inner circumference of the irradiation region 22a' can each have an angular corner (vertex). For example, the outer circumference and the inner circumference of the irradiation region 22a' can each have a rectangular shape.

CONCLUSION

A bonding method in accordance with Embodiment 1 is a bonding method for bonding a first member and a second member to each other, the first member being made of a material other than gold and having a surface on which a gold thin film is formed, the second member being made of a material other than gold, the bonding method including the steps of: (1) irradiating, with laser light, at least part of a specific region of the surface of the first member, so that a base of the thin film is exposed in the at least part of the specific region; and (2) bonding the second member to the specific region by use of an adhesive.

With the configuration, the second member is bonded to the base which is made of the material other than gold, instead of being bonded to the gold thin film. This makes it possible to achieve a higher adhesive force without carrying out any special treatment on the second member, as compared with a case where the second member is bonded to the gold thin film.

The bonding method in accordance with Embodiment 1 is preferably configured such that the step (1) is a step of sporadically irradiating each point in the specific region with laser light.

With the configuration, regions in each of which the base is exposed can be densely scattered in the irradiation region. Further, in a case where the step (1) is repeatedly carried out, it is possible to (i) gradually increase, in the specific region, a ratio of the regions in each of which the base is exposed and (ii) gradually reduce, in the specific region, a ratio of a region in which the thin film remains.

The bonding method in accordance with Embodiment 1 is preferably configured such that the step (1) is repeated until a sum total of an area of a region in which the thin film remains in the specific region becomes not more than 60% of an area of the specific region.

With the configuration, a bonding stress between the first member and the second member exceeds a predetermined value (1.4 MPa) which is considered to be sufficient for practical use.

The bonding method in accordance with Embodiment 1 is preferably configured such that the specific region is contained in a region to which the second member is bonded on the surface of the first member.

The configuration makes it possible to prevent the base of the thin film from coming into contact with outside air after the step (2) is carried out. Accordingly, it is possible to prevent a deterioration such as corrosion of the base of the thin film.

The bonding method in accordance with Embodiment 1 is preferably configured such that the specific region is a region whose outer circumference is constituted by a smooth curved line.

With the configuration, the outer circumference of the specific region has no angular corner on which a bending stress is likely to concentrate. Accordingly, a bending stress which is generated when the first member is warped is dispersed on the outer circumference of the specific region. This makes it possible to more strongly bond the first member and the second member to each other, as compared with a case where the outer circumference of the specific region has an angular corner.

The bonding method in accordance with Embodiment 1 is preferably configured such that the specific region is an annular region which extends along an outer circumference of a region to which the second member is bonded on the surface of the first member.

The configuration allows an area of the irradiation region to be smaller. This makes it possible to reduce a time required for the step (1).

The bonding method in accordance with Embodiment 1 is preferably configured such that the second member is a transparent member.

The configuration makes it possible to irradiate the adhesive with light (e.g., ultraviolet) through the second member, so that the step (2) can be easily carried out.

A manufacturing method in accordance with Embodiment 1 is a manufacturing method for manufacturing a structure including a first member and a second member, the first member being made of a material other than gold and having a surface on which a gold thin film is formed, the manufacturing method including the steps of: (1) irradiating, with laser light, a specific region of the surface of the first member, so that a base of the thin film is exposed in the specific region; and (2) bonding the second member to the specific region by use of an adhesive.

The manufacturing method in accordance with Embodiment 1 brings about an effect similar to that of the bonding method in accordance with Embodiment 1.

A structures in accordance with Embodiment 1 is a structure including: a first member; and a second member, the first member being made of a material other than gold and having a surface on which a gold thin film is formed, the surface of the first member containing a specific region in which a base of the thin film is exposed by irradiation with laser light, the second member being bonded to the specific region by use of an adhesive.

The structure in accordance with Embodiment 1 brings about an effect similar to that of the bonding method in accordance with Embodiment 1.

ADDITIONAL REMARKS

The present invention is not limited to the embodiments, but can be altered by a skilled person in the art within the scope of the claims. An embodiment derived from a proper combination of technical means each disclosed in a different embodiment is also encompassed in the technical scope of the present invention.

INDUSTRIAL APPLICABILITY

The present invention is applicable to a bonding method for bonding two members to each other by use of an adhesive. Further, the present invention is applicable to a structure including two members which are bonded to each other and a manufacturing method for manufacturing the structure.

REFERENCE SIGNS LIST

S1: Bonding method
S11: Irradiation step
S12: Bonding step
1: Structure
11: First member
11a: Base material
11b: Thin film
11c: Thin film
12: Thin film
12a: Irradiation region (specific region)
12b: Bonding region (region to which second member is bonded)
13: Adhesive
14: Second member

The invention claimed is:
1. A structure comprising:
a first member; and
a second member,
the first member being made of a material other than gold and having a surface on which a gold thin film is formed,
the second member being made of a material other than gold,
the first member containing a specific region, the surface of the first member being exposed by removing the gold thin film via laser irradiation with laser light in at least a part of the specific region,
the second member being bonded to the specific region by use of an adhesive,
wherein:
the specific region is contained in a region to which the second member is bonded on the surface of the first member and the specific region has an outer circumference having no angular corner; and a sum total of an area of a region in which the gold thin film remains in the specific region is greater than 0% but not more than 60% of an area of the specific region.

2. The structure as set forth in claim 1, wherein the specific region is an annular region which extends along an outer circumference of a region to which the second member is bonded on the surface of the first member.

3. The structure as set forth in any one of claim 1, wherein the second member is a transparent member.

4. A structure comprising:

a first member; and a second member, the first member being made of a material other than gold and having a surface on which a gold thin film is formed, the second member being made of a material other than gold, the first member containing a specific region, the surface of the first member being exposed by removing the gold thin film via laser irradiation with laser light in at least a part of the specific region, the second member being bonded to the specific region by use of an adhesive, wherein the specific region is an annular region which extends along an outer circumference of a region to which the second member is bonded on the surface of the first member, and a sum total of an area of a region in which the gold thin film remains in the specific region is greater than 0% but not more than 60% of an area of the specific region.

5. The structure as set forth in claim 4, wherein the second member is a transparent member.

\* \* \* \* \*